(12) United States Patent
Ding et al.

(10) Patent No.: US 8,900,964 B2
(45) Date of Patent: Dec. 2, 2014

(54) INDUCTORS AND WIRING STRUCTURES FABRICATED WITH LIMITED WIRING MATERIAL

(75) Inventors: Hanyi Ding, Colchester, VT (US); Jeffrey P. Gambino, Westford, VT (US); Zhong-Xiang He, Essex Junction, VT (US); Alvin J. Joseph, Williston, VT (US); Anthony K. Stamper, Williston, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 13/367,895

(22) Filed: Feb. 7, 2012

(65) Prior Publication Data

US 2013/0200521 A1 Aug. 8, 2013

(51) Int. Cl.
*H01L 21/20* (2006.01)
*H01L 27/08* (2006.01)

(52) U.S. Cl.
USPC ............ 438/381; 257/531; 257/E21.022

(58) Field of Classification Search
CPC ............ H01L 23/5227; H01L 23/5229; H01L 23/5283; H01L 23/531; H01L 23/66; H01L 23/645; H01L 28/10
USPC .......... 257/277, 531, 758, E21.022, E23.142; 438/238, 622, 381
See application file for complete search history.

(56) References Cited

U.S. PATENT DOCUMENTS

| | | | |
|---|---|---|---|
| 6,329,234 B1 * | 12/2001 | Ma et al. ...................... | 438/210 |
| 6,653,737 B2 | 11/2003 | Horak et al. | |
| 7,741,698 B2 | 6/2010 | Chinthakindi et al. | |
| 8,329,573 B2 * | 12/2012 | Viswanadam ............... | 438/618 |
| 2002/0142581 A1 * | 10/2002 | Horak et al. ................. | 438/626 |
| 2003/0076209 A1 * | 4/2003 | Tsai et al. .................... | 336/200 |
| 2004/0157370 A1 * | 8/2004 | Gardner ....................... | 438/106 |
| 2008/0277759 A1 * | 11/2008 | Chinthakindi et al. ....... | 257/531 |
| 2009/0179268 A1 * | 7/2009 | Abou-Khalil et al. ........ | 257/347 |
| 2013/0062729 A1 * | 3/2013 | Hopper et al. ................ | 257/531 |

* cited by examiner

*Primary Examiner* — Cheung Lee
*Assistant Examiner* — Jeremy Joy
(74) *Attorney, Agent, or Firm* — Wood, Herron & Evans LLP; Anthony J. Canale

(57) ABSTRACT

Back-end-of-line (BEOL) wiring structures and inductors, methods for fabricating BEOL wiring structures and inductors, and design structures for a BEOL wiring structure or an inductor. A feature, which may be a trench or a wire, is formed that includes a sidewall intersecting a top surface of a dielectric layer. A surface layer is formed on the sidewall of the feature. The surface layer is comprised of a conductor and has a thickness selected to provide a low resistance path for the conduction of a high frequency signal.

12 Claims, 7 Drawing Sheets

INDUCTORS AND WIRING STRUCTURES FABRICATED WITH LIMITED WIRING MATERIAL

BACKGROUND

The invention relates generally to semiconductor device fabrication and, more specifically, to methods for fabricating wiring structures and inductors during back-end-of-line (BEOL) processing, BEOL wiring structures and inductors, and design structures for BEOL wiring structures and inductors formed from the wiring of a BEOL wiring structure.

On-chip inductors are passive devices commonly utilized in monolithic integrated circuits designed to operate at high frequencies, such as those found in wireless communication devices. In particular, on-chip inductors may be utilized in radiofrequency integrated circuits (RFICs), which are found in applications such as Phase-Locked Loop (PLL) transmitters, voltage controlled oscillators (VCOs), impedance matching networks, filters, etc.

On-chip inductors may be integrated into one or more of the metallization levels of a BEOL wiring structure. Because BEOL wiring structures are routinely employed in chip fabrication to form the metal interconnect structures for integrated circuits, on-chip inductors may be formed with standard semiconductor processing steps without introducing additional processing steps or additional masks. In particular, a BEOL wiring structure is commonly fabricated using damascene processes in which vias and trenches in various dielectric layers are filled with metal to create multi-level, high-density interconnections with device structures in the integrated circuit. An on-chip inductor may be formed as a group of metal wires within a metallization level of the BEOL wiring structure.

An inductor has a winding resistance from the metal wires forming the coils, which appears in the circuit as a resistance in series with the inductor. The inductor's resistance converts electric current through the coils into heat, which is source of the energy loss. The quality factor Q represents a ratio of inductive reactance to resistance at a given frequency, and is a metric reflecting inductor efficiency. As its Q factor increases, the inductor approaches the behavior of an ideal, lossless inductor.

Improved methods are needed for fabricating BEOL wiring structures and on-chip inductors, as well as improved BEOL wiring structures and on-chip inductors and improved design structures for a BEOL wiring structure or on-chip inductor.

SUMMARY

In an embodiment of the invention, a method is provided for a back-end-of-line wiring structure. The method includes forming a feature having a sidewall intersecting a top surface of a dielectric layer and forming a surface layer on the sidewall of the feature. The surface layer is comprised of a conductor and has a thickness selected to provide a low resistance path for conducting a high frequency signal.

In an embodiment of the invention, a wiring structure includes a feature having a sidewall intersecting a top surface of a dielectric layer and a surface layer on the sidewall of the feature. The surface layer is comprised of a conductor and has a thickness selected to provide a low resistance path for conducting a high frequency signal.

According to another embodiment of the present invention, a design structure is provided that is readable by a machine used in design, manufacture, or simulation of an integrated circuit. The design structure includes a feature having a sidewall intersecting a top surface of a dielectric layer and a surface layer on the sidewall of the feature. The surface layer is comprised of a conductor and has a thickness selected to provide a low resistance path for conducting a high frequency signal. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
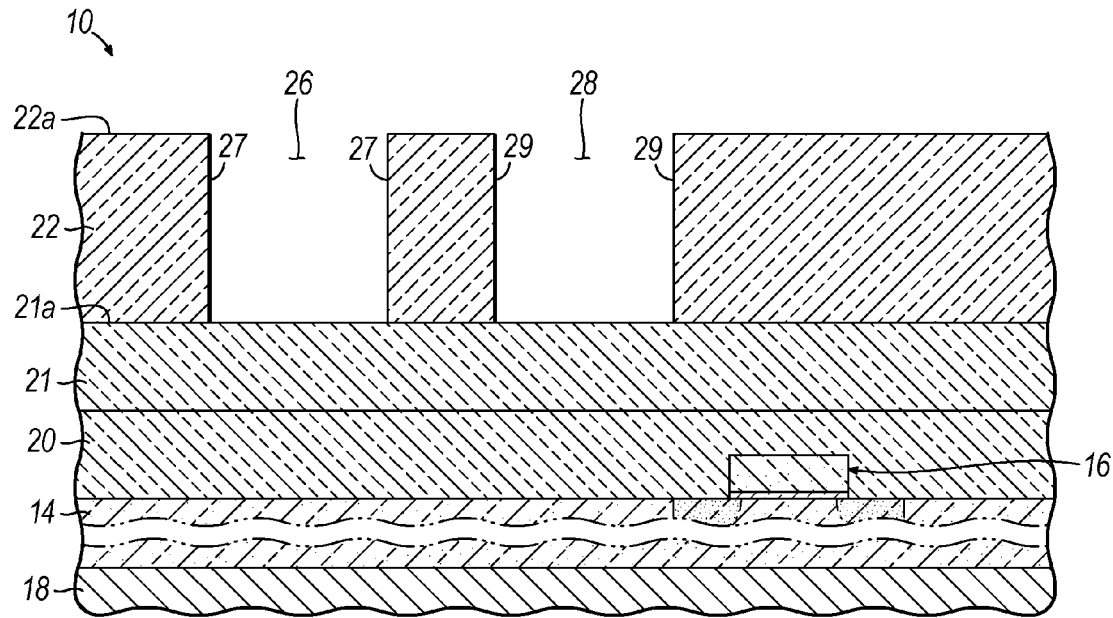
FIGS. 1-3 are cross-sectional views of a BEOL wiring structure at successive fabrication stages of a processing method in accordance with an embodiment of the invention.

With reference to FIG. 1 and in accordance with an embodiment of the invention, a chip 10 includes a back-end-of-line (BEOL) interconnect structure 12, a substrate 14, and front-end-of-line devices 16, such as field-effect transistors, of an integrated circuit formed using the substrate. A ground plane 18 is supplied by the chip package. The substrate 14 may be any type of suitable bulk substrate comprising a semiconductor material suitable for forming an integrated circuit. For example, the substrate 14 may be a wafer comprised of a monocrystalline silicon-containing material, such as single crystal silicon wafer with a (100) crystal lattice orientation. Typical constructions for the BEOL interconnect structure consist of two (2) to ten (10) metallization levels formed by damascene processes and/or subtractive etching processes.

At this fabrication stage, the BEOL interconnect structure 12 includes a plurality of dielectric layers 20, 21, 22 that have a characteristic stacked arrangement. Trenches 26, 28 are formed in the dielectric material of the dielectric layer 22 by lithography and etch operations. The trenches 26, 28 are adjacent to each other in the dielectric layer 22. In the lithography operation, a resist layer (not shown) is applied on a top surface 22a of the dielectric layer 22, exposed to impart a latent image pattern, and developed to transform the latent image pattern into a final image pattern having unmasked areas at the intended locations for the trenches 26, 28. The dielectric layer 22 is etched with an etching process, such as RIE, using the patterned resist as an etch mask to localize the position of the trenches 26, 28. After the etching process concludes, the resist is stripped by, for example, oxygen plasma ashing or chemical stripping.

The trench 26 includes sidewalls 27 extending into the dielectric layer 22 and closed at their base by a portion of the top surface 21a of dielectric layer 21. Trench 28 includes sidewalls 29 extending into the dielectric layer 22 and closed at their base by another portion of the top surface 21a of dielectric layer 21. The sidewalls 27, 29 and the portions of the top surface 21 represent surfaces that are coextensive with the open space inside the trenches 26, 28. The trenches 26, 28 may have a depth greater than or equal to 10 microns (μm). The trenches 26, 28 represent features that have a non-planar relationship with the top surface 22a of dielectric layer 22. In particular, trenches 26, 28 have respective sidewalls 27, 29 that intersect the top surface 22a and that extend from that intersection below the top surface 22a and into the bulk of the dielectric layer 22.

Figure 2:
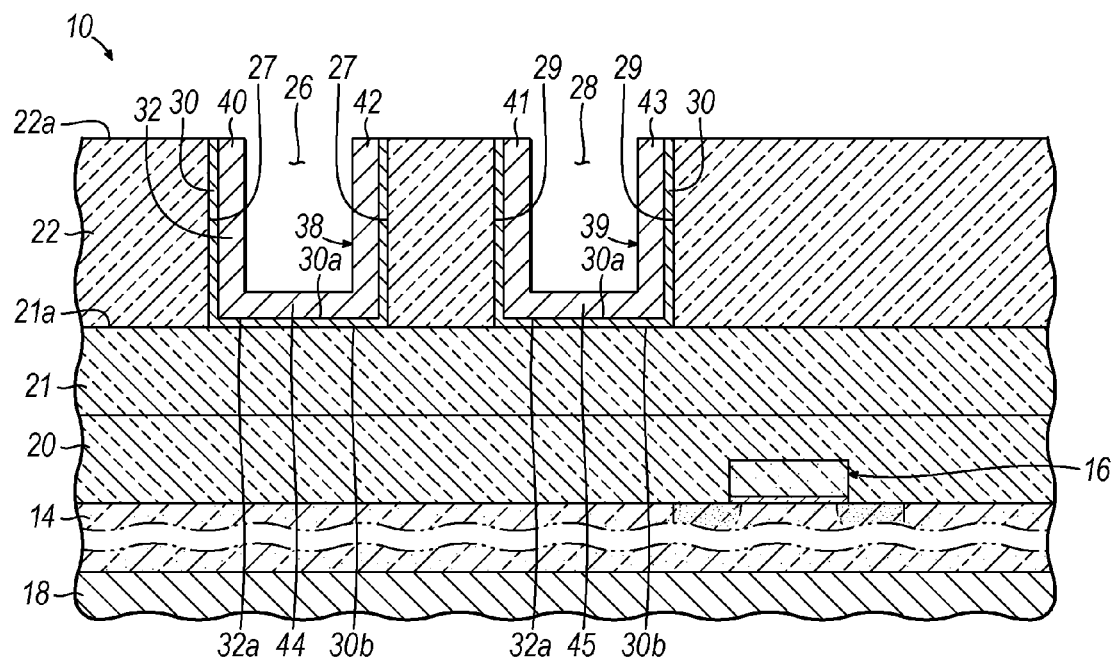

With reference to FIG. 2 in which like reference numerals refer to like features in FIG. 1 and at a subsequent fabrication stage, a barrier layer 30 and a conductor layer 32 are sequentially applied as surface layers in a layer stack that coats dielectric layer 22 on the sidewalls 27, 29 and the top surface 21a of dielectric layer 21 exposed by the trenches 26, 28 (FIG. 1), as well as the top surface 22a of dielectric layer 22. A bottom surface 30b of the barrier layer 30 contacts, preferably directly, sidewalls 27, 29 and the portions of the top surface 21a exposed by the trenches 26, 28. A bottom surface 32a of conductor layer 32 directly contacts a top surface 30a of barrier layer 30 so that layers 30, 32 are in physical contact and in electrical continuity and so that the conductor layer 32 indirectly contacts the dielectric layers 21, 22. The conductor layer 32 indirectly contacts dielectric layer 22 over the sidewalls 27, 29 (FIG. 1) and portions of the top surface 21a of dielectric layer 21 inside the trenches 26, 28 (FIG. 1).

The conductive material of conductor layer 32 only fills a minor fraction of the open space inside the trenches 26, 28 and effectively defines wires 38, 39 that are hollow. Wire 38 is comprised of a plurality of surface layers including vertical wire segments 40, 42 and a horizontal wire segment 44 that connects the vertical wire segments 40, 42 at their respective lower ends. The vertical wire segments 40, 42 are positioned on dielectric layer 22 along the sidewalls 27 of the trench 26. The horizontal wire segment 44 is positioned on a portion of the top surface 21a of dielectric layer 21 exposed by the trench 26. Wire 39 is comprised of a plurality of surface layers including vertical wire segments 41, 43 and a horizontal wire segment 45 connecting the respective lower ends of the vertical wire segments 41, 43. The vertical wire segments 41, 43 are positioned on dielectric layer 22 along the sidewalls 29 of the trench 28 and extend about the perimeter of the trench 28. The horizontal wire segment 45 is positioned on another portion of the top surface 21a of dielectric layer 21 exposed by the trench 28.

The wire segments 40-45, which are all formed from the conductor layer 32, may have the same thickness. The vertical wire segments 40-43 may have a height commensurate with the depth of the trenches 26, 28. The formation of the trenches 26, 28 in the dielectric layer 22 and the application of layers 30, 32 are provided in a process flow characteristic of a damascene process.

The barrier layer 30 is comprised of a conductor, such as titanium (Ti), titanium nitride (TiN), tantalum nitride (TaN), tantalum (Ta), another suitable conductive material, or a layered combination of conductive materials such as bilayer comprised of a TaN layer and a Ta layer. The barrier layer 30 operates as a diffusion barrier for at least the material comprising the conductor layer 32. The barrier layer 30 may be deposited, for example, by physical vapor deposition (PVD), ionized-PVD (iPVD), atomic layer deposition (ALD), plasma-assisted atomic layer deposition, CVD, or PECVD.

The conductor layer 32 may be comprised of an electrically conductive material, such as a metal like copper (Cu), gold (Au), or silver (Ag), or a metal alloy like a co-deposited aluminum-copper alloy (AlCu), characterized by a relatively low electrical resistivity (i.e., a relatively high electrical conductivity). The conductor layer 32 may be deposited, for example, by PVD. The conductor layer 32 may be optionally thickened by depositing an additional thickness of the electrically conductive material by, for example, electroless deposition or electrodeposition. In this instance, the conductor layer 32 operates as a seed layer to promote the deposition of the additional thickness of the electrically conductive material. The thickness of the conductor layer 32 is controlled so that the conductor layer 32 only fills a fraction of the space inside the trenches 26, 28. A chemical-mechanical polishing (CMP) process is used to remove the layers 30, 32 from the top surface 22a of dielectric layer 22 and to planarize the top surface 22a of dielectric layer 22. The upper ends of the barrier layer 30 and conductor layer 32 are coplanar with the top surface 22a following planarization.

In one embodiment, wires 38, 39 may be used, for example, as distinct transmission lines for high frequency signals, such as radiofrequency signals that are used for broadcasting or other communication modulation in millimeter wave chips and radio frequency integrated circuits (RFIC). In this embodiment, the wires 38, 39 may lack electrical continuity such that the same signal is not carried by both wires 38, 39. The wires 38, 39 may exhibit minimal signal loss at radiofrequencies characteristic of an RFIC.

Figure 2A:
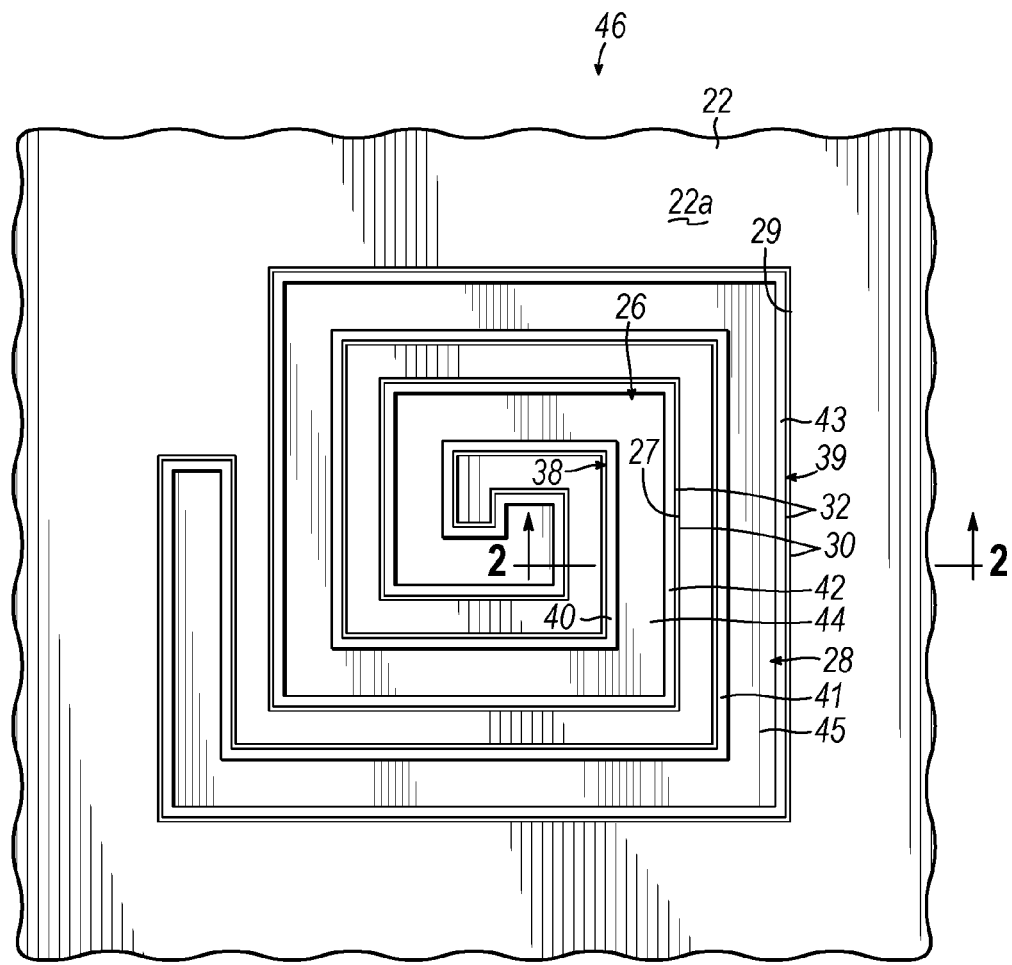
FIG. 2A is a top view of an inductor that generally includes the cross-sectional view of FIG. 2 taken generally along line 2-2.

Alternatively and as shown in FIG. 2A, wires 38, 39 may be electrically continuous and arranged to constitute windings of an on-chip inductor 46. The on-chip inductor 46 may have a square coiled geometrical shape in which the windings have a helical arrangement. However, the windings of the inductor 46 may have an alternative geometrical shape, such as polygonal (e.g., octagonal) coil or a circular coil. The number of individual windings in the inductor 46, each of which may comprise a wire constructed like wires 38, 39, may range from two (2) to ten (10). The on-chip inductor 46 may be characterized by its quality factor, Q, which is a metric of inductor performance in an RFIC and which represents a measure of the relationship between energy loss and energy storage. Parasitic capacitance and parasitic resistance from eddy current losses are generated between the wires 38, 39 forming the on-chip inductor 46 and the substrate 14. Because of the construction of the wires 38, 39, the on-chip inductor 46 may exhibit a high value for the quality factor, Q, which reflects low energy losses to the substrate 14.

Figure 3:
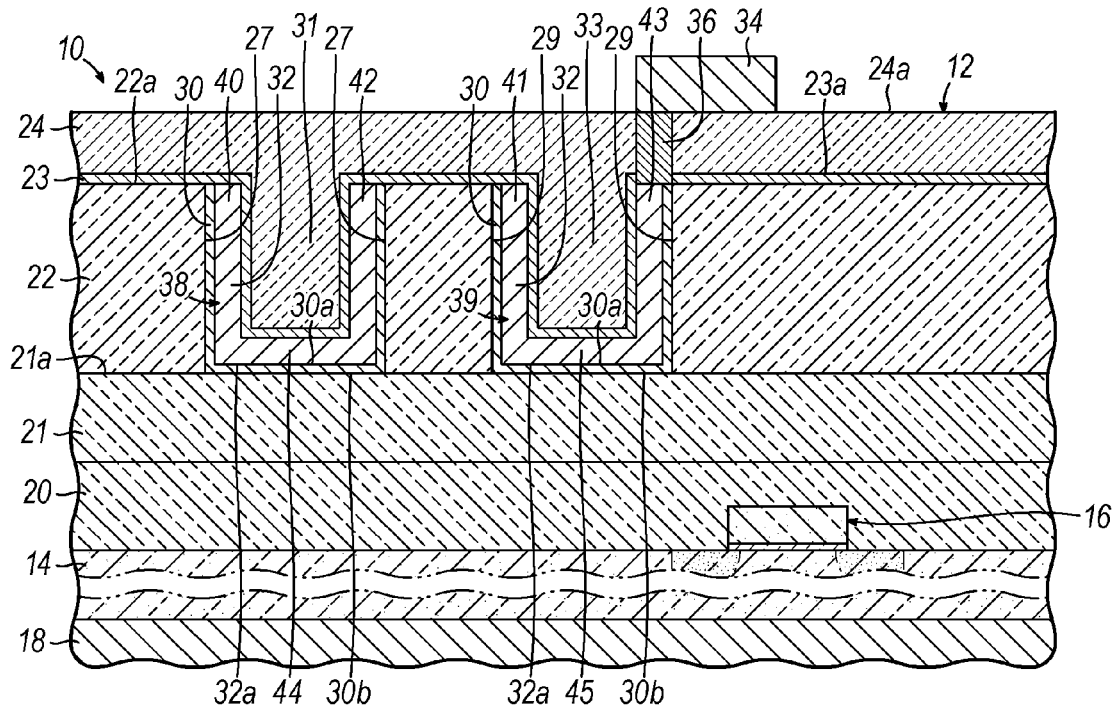

With reference to FIG. 3 in which like reference numerals refer to like features in FIG. 2 and at a subsequent fabrication stage, a dielectric layer 23 is deposited as a relatively thin conformal layer that covers the conductor layer 32, as well as the top surface 22a of dielectric layer 22. Dielectric layer 23 may operate as a diffusion barrier for the conductive material comprising the conductor layer 32. Dielectric layer 24 is deposited as a thicker layer that fills the remainder of the open space inside the trenches 26, 28 that is not occupied by the layers 30, 32 and the dielectric layer 23. The top surface of dielectric layer 24 is planarized and a reverse mask may be utilized in the planarization process to lessen the impact of topography from the trench filling.

Dielectric layers 23, 24 introduce additional levels to the stacked arrangement of dielectric layers 20-22. Each of the dielectric layers 20-24 may comprise any organic or inorganic dielectric material recognized by a person having ordinary skill in the art as a suitable electrical insulator for the BEOL interconnect structure 12. Candidate inorganic dielectric materials may include, but are not limited to, silicon dioxide ($SiO_2$), silicon nitride ($Si_3N_4$), fluorine-doped silicon glass (FSG), silicon carbon nitride (SiCN), and combinations of these dielectric materials. Alternatively, the dielectric material of one or more of the dielectric layers 20-24 may be characterized by a relative permittivity or dielectric constant smaller than the dielectric constant of silicon dioxide, which is about 3.9. Candidate low-k dielectric materials include, but are not limited to, porous and nonporous spun-on organic low-k dielectrics, such as spin-on aromatic thermoset polymer resins like polyarylenes, porous and nonporous inorganic low-k dielectrics like organosilicate glasses, hydrogen-enriched silicon oxycarbide (SiCOH), and carbon-doped oxides, and combinations of these and other organic and inorganic dielectrics. The dielectric layers 20-24 may be deposited by any number of well known conventional techniques such as sputtering, spin-on application, chemical vapor deposition (CVD) or a plasma-enhanced chemical vapor deposition (PECVD).

A wire 34 may be formed on a planarized top surface of dielectric layer 24 and may be connected with the conductor layer 32 inside the trench 28 by a conductive plug 36 inside a connecting via. The wire 34 may be disposed in a last layer of the BEOL wiring structure 12. The wire 34 may be formed on a top surface 24a of dielectric layer 24 by depositing a conductor layer on the top surface 24a and patterning the conductive layer with photolithography and subtractive etching processes. The photolithography process applies a patterned etch mask on the deposited conductor layer and the subtractive etching process with an etch chemistry that removes unmasked regions of the conductor layer and stops on the material of dielectric layer 24. The wire 34 may be comprised of aluminum (Al) and, in this circumstance, the etch process may be a chlorine-based RIE process.

Portions 31, 33 of the insulating material of dielectric layers 23, 24, primarily, the insulating material of dielectric layer 24, fill the majority of the trenches 26, 28. The space between the vertical wire segments 40, 42 of the wire 38 and the vertical wire segments 41, 43 of the wire 39 is unfilled by conductive material and is instead space occupied by respective portions 31, 33 comprised of one or more electrical insulators from the dielectric layers 23, 24.

The wires 38, 39 represent wiring structures that may replace solid super thick analog wires formed by a damascene process in which trenches are fully occupied by the conductor. The wires 38, 39 may conduct radiofrequency signals in a fashion similar to solid super thick analog wires, but the amount of conductor needed to form the wires 38, 39 is reduced by merely cladding the trenches 26, 28 with a comparatively thin layer 32 of conductive material.

The thickness of the wires 38, 39 may be selected to be equal to a skin depth of the constituent conductor at the operational signal frequency of the circuit containing the wires 38, 39. High frequency signals at a give operating frequency may be conducted by only a fraction of the cross-sectional area of a wire. Because of a phenomenon known as skin effect, propagating radiofrequency signals do not penetrate deeply into the body of a solid wire but instead the current travels within a thickness beneath the outer surface known as the skin depth. In a good conductor such as Cu, the skin depth varies as the inverse square root of the signal frequency and as the square root of the resistivity of the conductor (i.e., the inverse square root of the conductivity). In one example, a high frequency signal propagating in a good conductor at an operating frequency of 40 GHz may have a significantly smaller skin depth than a radiofrequency signal at an operating frequency of 5 GHz. Consequently, better electrical conductors have a smaller skin depth and, despite the reduced skin depth, the alternating current (AC) resistance is reduced when a conductor of higher conductivity (i.e., lower resistivity) is substituted for a conductor with a lower conductivity (i.e., a higher resistivity). However, the reduction in AC resistance is minimized, when substituting a metal of higher conductivity, if the dimensions of the conductor are greater than the skin depth for that operating frequency.

The hollow wires 38, 39 leverage the frequency dependence of skin depth by arranging the conductor only in skin depth regions, which affects the RC delay and thereby allows for taller wires and reduced RC delay in comparison with conventional solid super thick analog wires. In particular, the vertical wire segments 40-43 of the hollow wires 38, 39 may be at least 10 µm tall, and the wires 38, 39 may have an aspect ratio of height to width greater than or equal to 10.

In addition, because the trenches 26, 28 are only partially filled with conductor, the conductor thickness that must be removed by planarization during the damascene process to define wires 38, 39 is significantly reduced and limited in comparison with solid super thick wires. To form solid super thick analog wires with a damascene process, the thickness of conductor layer 32 must be adequate to completely fill the trenches 26, 28 and a commensurate thickness of the constituent conductive material is deposited on the top surface 21a of dielectric layer 21 and must be removed by planarization.

In one embodiment, the process used to form the wires 38, 39 may be a patterned plate process. In particular, the excess conductor 32 may be removed from top surface 22a of dielectric layer 22 such that, should additional conductor be added by electroplating or electroless deposition, conductor is not deposited on the top surface 22a due to the absence of a seed layer.

Figure 4:
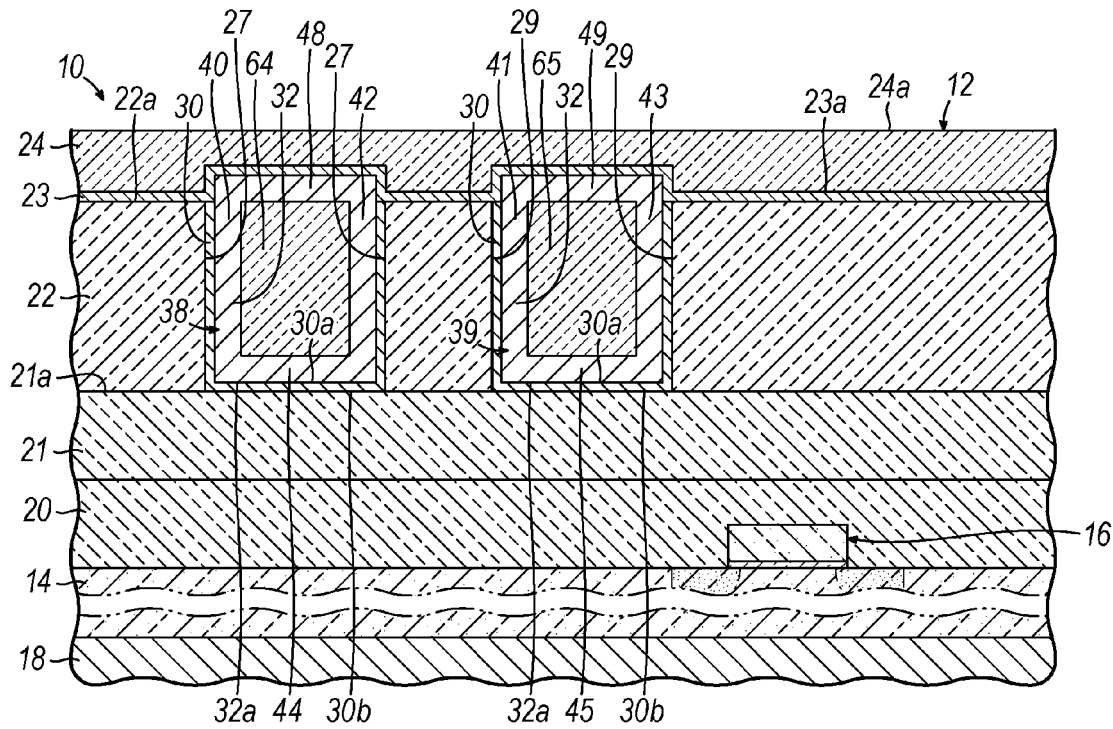
FIGS. 4, 5, 6, and 7 are cross-sectional views similar to FIG. 2 of a BEOL wiring structure in accordance with alternative embodiments of the invention.

With reference to FIG. 4 in which like reference numerals refer to like features in FIG. 3 and in accordance with an alternative embodiment, horizontal wire segments 48, 49 may be added to the wires 38, 39 of BEOL interconnect structure 12 and the open spaces inside the hollow wires 38, 39 may be filled with portions 64, 65 of an electrical insulator. To that end, a layer of the electrical insulator may be deposited after the layers 30, 32 are deposited and then planarized to form the portions 64, 65. The electrical insulator in the portions 64, 65 may comprise one or more of the dielectric materials comprising dielectric layers 20-24. The dielectric material portions 64, 65 are formed after the wire segments 40-45 are formed and before the horizontal wire segments 48, 49 are formed. In this embodiment, wire 34 and conductive plug 36 (FIG. 3) are omitted from the BEOL interconnect structure 12.

Horizontal wire segment 48 caps the vertical wire segments 40, 42 of wire 38 and may be oriented parallel to the horizontal wire segment 44. Horizontal wire segment 48 may connect the vertical wire segments 40, 42 at their respective upper ends. Horizontal wire segment 49 caps the vertical wire segments 41, 43 of wire 38 and may be oriented parallel to the horizontal wire segment 45. Horizontal wire segment 49 may connect the vertical wire segments 41, 43 at their respective upper ends. The horizontal wire segments 48, 49 have respective lower surfaces that are coplanar with the top surface 22a of dielectric layer 22 and the upper ends of the vertical wire segments 40-43. The horizontal wire segments 48, 49 represent surface layers that may at least partially cover the trenches 26, 28. In the representative embodiment, opposite ends of the horizontal wire segment 48 completely overlap with the vertical wire segments 40, 42 so that the portion 64 of insulator is enclosed by the wire segments 40, 42, 44, 48 and opposite ends of the horizontal wire segment 49 completely overlap with the vertical wire segments 41, 43 so that the portion 65 of insulator is enclosed by the wire segments 41, 43, 45, 49.

The horizontal wire segments 48, 49 may be formed by depositing a layer of conductive material and patterning the layer with photolithography and subtractive etching processes. The horizontal wire segment 48 may have the same thickness as one or more of the wire segments 40, 42, 44 of wire 38 and the horizontal wire segment 49 may have the same thickness as one or more of the wire segments 41, 43, 45 of wire 39. The horizontal wire segments 48, 49 may be comprised of any of the conductors comprising the wire segments 40-45.

Figure 5:
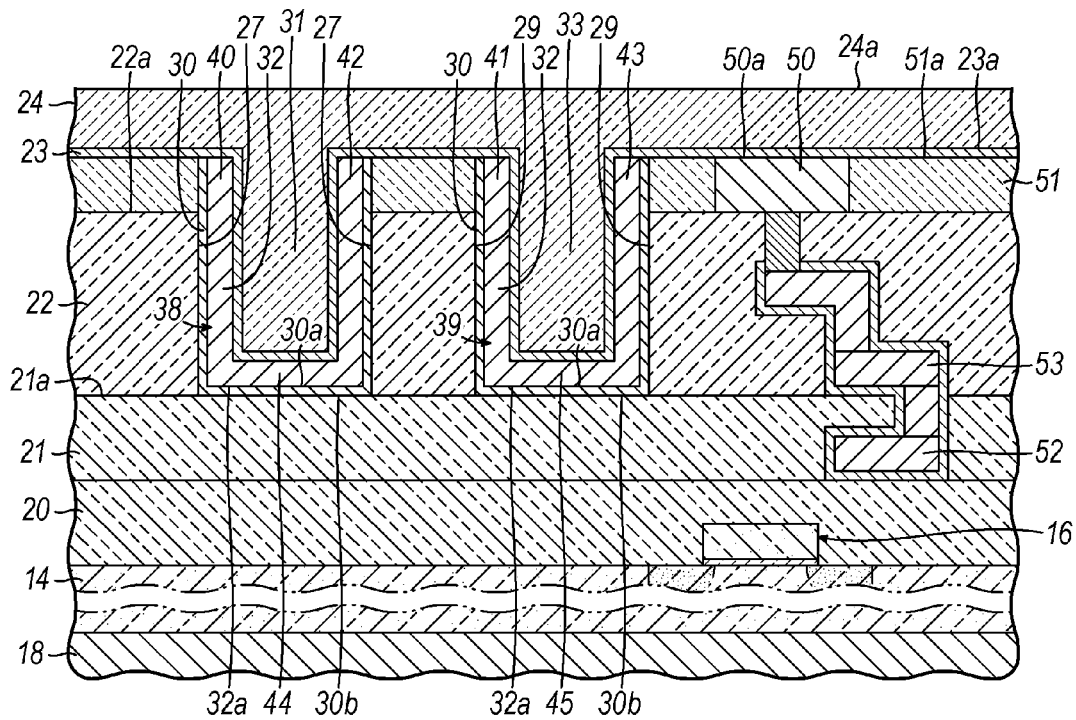

With reference to FIG. 5 in which like reference numerals refer to like features in FIG. 4 and in accordance with an alternative embodiment, a wire 50 is coupled by a conductive path 53 in the BEOL wiring structure 12 with a wire 52 in a lower level of the BEOL wiring structure 12. Wire 50 may be formed with photolithography and subtractive etching processes as described above in connection with wire 34. A dielectric layer 51 is then deposited and planarized to provide a flat surface for dielectric layers 23, 24. The dielectric layer 51 may be comprised of the same dielectric materials as dielectric layers 20-24. The thickness of the wire 50 may be equal to the thickness of the dielectric layer 51 and a top surface 50a of the wire 50 may be coplanar with the top surface 50a of the dielectric layer 51. The top ends of the wire segments 40-43 of wires 38, 39 may likewise be coplanar with the top surface 50a of wire 50.

Figure 6:
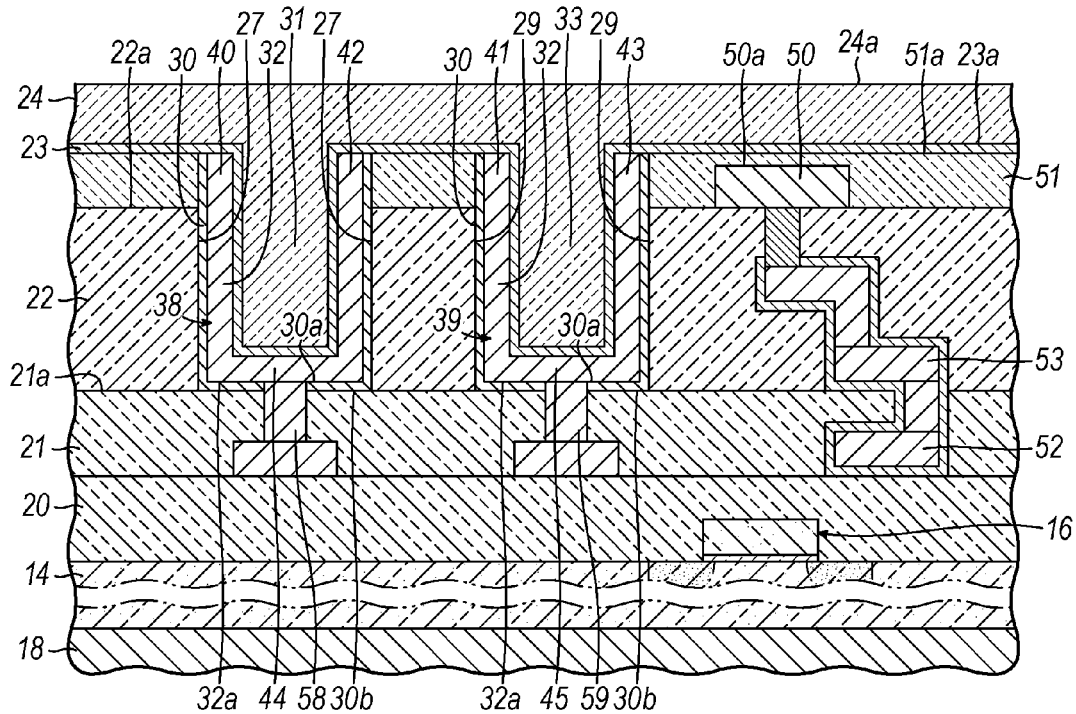

With reference to FIG. 6 in which like reference numerals refer to like features in FIG. 4 and in accordance with an alternative embodiment, the wire 50 is positioned on the top surface 21a of dielectric layer 21. However, the dielectric layer 51 has a greater thickness than the wire 50 so that the top surface 50a of the wire 50 is not coplanar with the top surface 51a of the dielectric layer 51. Instead, the wire 50 is buried beneath the top surface 51a of the dielectric layer 51. The top ends of the wire segments 40-43 of wires 38, 39 are coplanar with top surface 51a of the dielectric layer 51, but project above the top surface 50a of wire 50.

Conductor-filled vias 58, 59 may be optionally provided in the dielectric layer 21 of the BEOL wiring structure 12. The wires 38, 39 and conductor-filled vias 58, 59 may be formed by a dual-damascene process.

Figure 7:
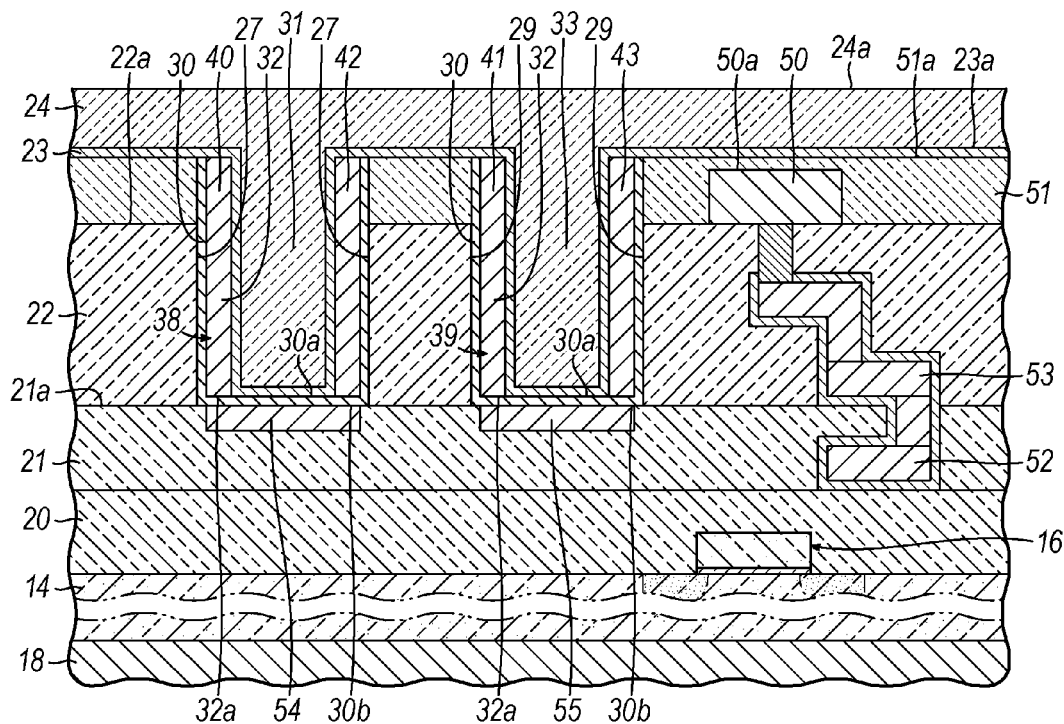

With reference to FIG. 7 in which like reference numerals refer to like features in FIG. 4 and in accordance with an alternative embodiment, the horizontal wire segments 44, 45 may be partially or entirely removed from the portion of the barrier layer 30 on the top surface 21a of dielectric layer 21 exposed by the trenches 26, 28. The removal of respective central portions or the entirety of the horizontal wire segments 44, 45 may be accomplished by anisotropic etching with RIE or directional sputtering with non-reactive ions. The vertical wire segments 40, 42 of wire 38 effectively form spacers on the dielectric layer 22 coextensive with the sidewalls 27 of trench 26. The vertical wire segments 41, 43 of wire 39 also effectively form spacers on the dielectric layer 22 coextensive with the sidewalls 29 of trench 28.

Additional wires 54, 55 may be optionally provided in the dielectric layer 21 of the BEOL wiring structure 12, which underlies the metallization level containing wires 38, 39. These wires 54, 55 may be respectively stacked with the wires 38, 39.

Figure 8:
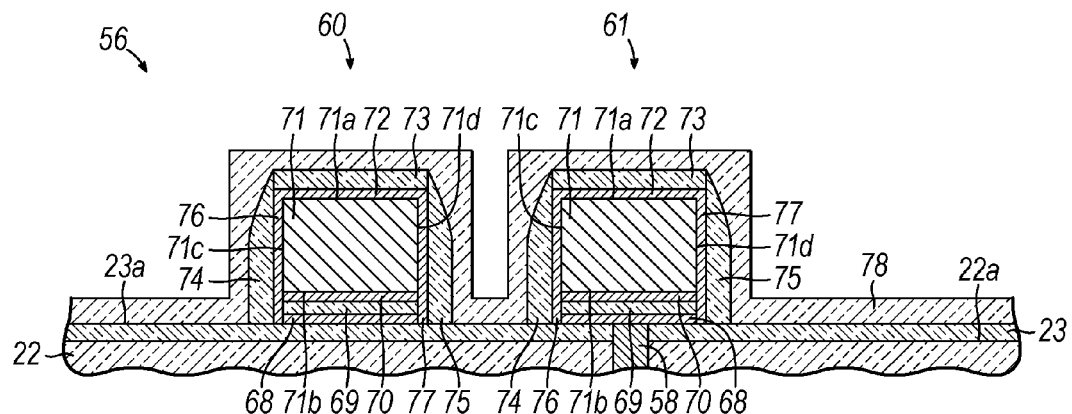
FIG. 8 is a cross-sectional view of a BEOL wiring structure in accordance with an embodiment of the invention.

With reference to FIG. 8 in which like reference numerals refer to like features in FIG. 1 and in accordance with an alternative embodiment, a BEOL wiring structure 56 includes wires, generally indicated by reference numerals 60, 61. Each of the wires 60, 61 includes a plurality of layers 68, 69, 70, 71, 72, 73 that are arranged in a vertical layer stack, spacers 74, 75 formed on the opposite sidewalls of layers 68-73, and layers 76, 77 that are respectively disposed between the spacers 74, 75 and the sidewalls of layers 68-73. Layers 68-73 are applied to the top surface 23a of dielectric layer 23 as a layer stack and then patterned with photolithography and subtractive etching processes. The spacers 74, 75 may be formed on the sidewalls of the layers 68-73 by a spacer formation process. For example, the spacers 74, 75 may be formed by depositing a conformal layer of the constituent conductor and then anisotropically etching the conformal conductor layer with an etching process, for example, RIE to preferentially remove the conductor from horizontal surfaces. The additive portion of the conductor on top of layer 73 is removed by the etching process so that layer 73 is preserved.

Layer 71 represents a bulk portion of the vertical layer stack of layers 68-73 and may have the largest thickness among the layers 68-73. The wires 60, 61 may be considered to be composite structures in which layer 71 represents a thick wiring structure having an individual thickness of about 3.5 μm or greater. The wires 60, 61 represent features that have a non-planar relationship with the top surface 22a of dielectric layer 22 and, in particular, that project above the top surface 22a of dielectric layer 22.

Layer 71 may be comprised of a conductor, such as AlCu. Layers 69, 73 and the spacers 74, 75 may be comprised of a conductor that has a lower electrical resistivity (i.e., a higher electrical conductivity) than the conductor comprising layer 71. For example, if layer 71 is comprised of AlCu, then the layers 69, 73 and the spacers 74, 75 may be comprised of copper (Cu), gold (Au), or silver (Ag), each of which has a higher conductivity than an aluminum-copper alloy (AlCu). In particular, the conductor comprising the layers 69, 73 and the spacers 74, 75 may have a conductivity that is a factor of 2 or higher than the conductivity of layer 71. For example, Ag has a conductivity of $6.1 \times 10^7$ mΩ/M and Cu has a conductivity of $5.8 \times 10^7$ MΩ/M, which contrast with the conductivity for AlCu of $3.2 \times 10^7$ mΩ/M or barrier layer materials like TiN/TaN that are on the order of $10^5$ mΩ/M.

The layers 69, 73 and spacers 74, 75 define surface layers that clad or cap different surfaces of the layer 71 and, in the representative embodiment, define a shell that clads the exterior of the layer 71. Layer 73 is proximate to an exterior or outer top surface 71a of layer 71 and, in the representative embodiment, indirectly contacts the surface 71a because of the intervening presence of layer 72. Layer 69 is proximate to an exterior or outer bottom surface 71b of layer 71 and, in the representative embodiment, indirectly contacts the bottom surface 71b because of the intervening presence of layer 73. Spacer 74 is proximate to a sidewall 71c of layer 71 and, in the representative embodiment, indirectly contacts the exterior or outer surface of sidewall 71c because of the intervening presence of layer 76. Spacer 75 is proximate to a sidewall 71d of layer 71 from spacer 74 and, in the representative embodiment, indirectly contacts the exterior or outer surface of sidewall 71d because of the intervening presence of layer 77. The surfaces 71a, 71b are each transverse to sidewalls 71c, 71d and connected by the sidewalls 71c, 71d, the surfaces 71a, 71b may be parallel, and the sidewalls 71c, 71d may be parallel and are connected at their ends by additional sidewalls coextensive with the exterior surface of layer 71.

The wires 60, 61 represent composite wiring structures that improve upon super thick analog wires because of the presence of higher conductivity material in the skin regions defined by the layers 69, 73 and spacers 74, 75. Within an operating frequency range for which the skin depth is comparable to or less than the thicknesses of one or more of the layers 69, 73 and spacers 74, 75, the wires 60, 61 may exhibit a reduced AC resistance because signal propagation of high frequency signals may occur primarily or entirely within the layers 69, 73 and spacers 74, 75, rather than within the layer 71 representing the super thick analog wire. The higher electrical conductivity (i.e., lower resistivity) of the materials comprising layers 69, 73 and spacers 74, 75 covering layer 71 in comparison with the material comprising layer 71 provides the reduced AC resistance.

Within an operating frequency range, signal propagation may occur entirely within the layers 69, 73 and spacers 74, 75 if their physical layer thickness is greater than the skin depth for those operating frequencies. For example, the physical layer thickness of the layers 69, 73 and spacers 74, 75 may be selected such that signal transmission at an operating frequency of 40 GHz may occur entirely or primarily within the layers 69, 73 and spacers 74, 75 rather than within the layer 71 and signal transmission at a lower operating frequency (e.g., 5 GHz) may occur primarily within the layer 71. The reduced electrical resistance of layers 69, 73 and spacers 74, 75 may reduce the AC resistance at an operating frequency of 40 GHz and may also significantly reduce RC delay. This mixture of operating frequencies may be present, for example, in an RFIC. Within a broader operating frequency range, signal propagation may occur primarily within the layers 69, 73 and spacers 74, 75 if their physical layer thickness is less than the skin depth for those operating frequencies but the thickness is more than 50% of the skin depth. Over an even broader operating frequency range, signal propagation may occur partially within the layers 69, 73 and spacers 74, 75 of their physical layer thickness is less than 50% of the skin depth.

A dielectric layer 78 is applied that covers the wires 60, 61. The dielectric layers 22, 78 may be comprised of an insulator, such as $Si_3N_4$ or SiCN, that presents a diffusion barrier to the conductor comprising layers 68-73 and the conductor comprising spacers 74, 75. Layers 68, 70, 72, 76, 77 may be comprised of the same types of materials as the barrier layer 30.

Similar to wires 38, 39 (FIGS. 2, 2A), the wires 60, 61 may be used as transmission lines for radiofrequency signals or, alternatively, as coils of an inductor. Layer 68 may be coupled with a conductor-filled via 58 that is formed in dielectric layers 22, 23. The conductor resident in the via 58 may be comprised of tungsten (W).

In an alternative embodiment, both of the layers 69, 73 may be omitted so that only the spacers 74, 75 are present on the opposite sidewalls of layer 71. In another alternative embodiment, layer 72 may be omitted so that the spacers 74, 75 are present on the opposite sidewalls of layer 71 and layer 68 is present on the bottom of layer 71. In yet another alternative embodiment, layer 68 may be omitted so that the spacers 74, 75 are present on the opposite sidewalls of layer 71 and layer 72 is present on the top surface 71a of layer 71.

Figure 9:
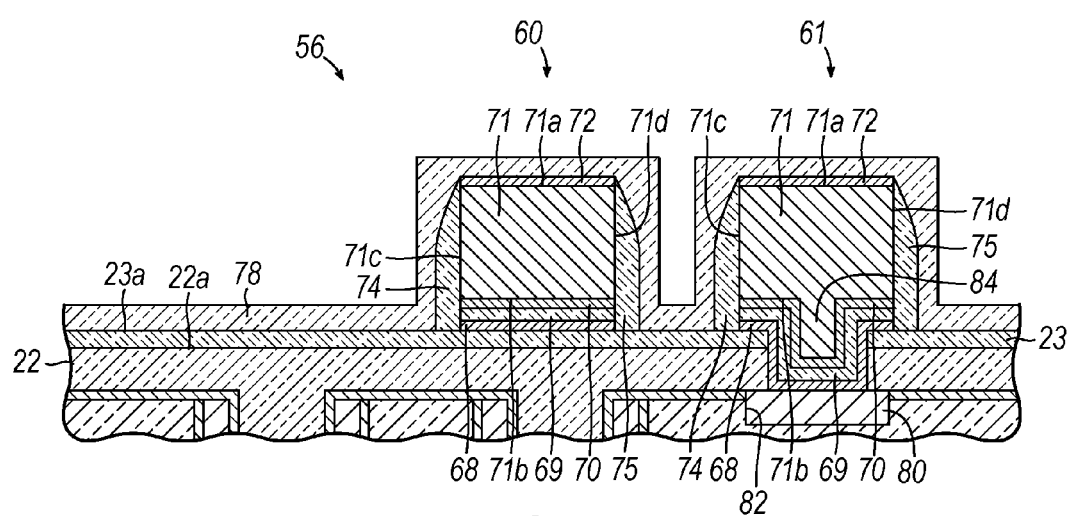
FIG. 9 is a cross-sectional view similar to FIG. 8 of a BEOL wiring structure in accordance with an alternative embodiment of the invention.

With reference to FIG. 9 in which like reference numerals refer to like features in FIG. 8 and in accordance with an alternative embodiment, the BEOL wiring structure 56 may further include a wire 80 in the dielectric layer 22 and a via or trench 82 in the dielectric layers 22, 23. Dielectric layer 24 is applied as a conformal layer on the via or trench 82. The layers 68, 69, 70 are likewise applied as conformal layers inside the via or trench 82 and separated from the dielectric material of dielectric layer 22 by the dielectric layer 24. Another layer 84, which may be comprised of the same conductor as layer 71 and that may directly contact layer 71, is formed inside of the via or trench 82. The process flow continues above as described in the context of FIG. 4. In this embodiment, layer 73 is shown as omitted from the construction of the wires 60, 61. However, the layer 73 may be present in wires 60, 61 either in addition to layer 69 or instead of layer 69, or layer 69 may also be omitted such that only the spacers 74, 75 are present.

Figure 10:
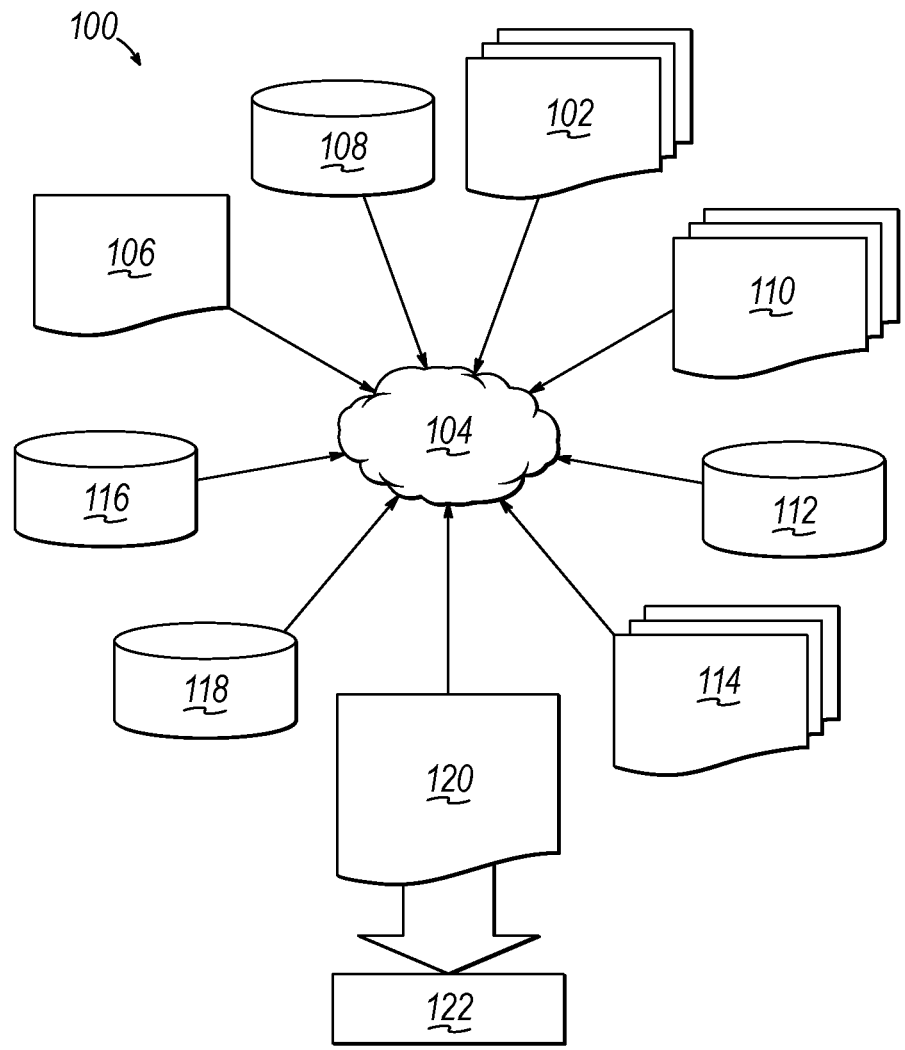
FIG. 10 is a flow diagram of a design process used in semiconductor design, manufacture, and/or test.

FIG. 10 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 2-9 and 2A. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 2-9 and 2A. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 2-9 and 2A to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 84 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-8 AND 4A. In one embodiment, design structure 120 may comprise a compiled, executable HDL simulation model that functionally simulates the devices shown in FIGS. 2-9 and 2A.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-9 and 2A. Design structure 120 may then proceed to a stage 122 where, for example, design structure 120: proceeds to tape-out, is released to manufacturing, is released to a mask house, is sent to another design house, is sent back to the customer, etc.

The methods, as described above, are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. The term "lateral" refers to a dimension within the horizontal plane.

It will be understood that when a structure is described as being "connected" or "coupled" to or with another structure, it can be directly connected or coupled with the other structure or, instead, one or more intervening structures may be present. In contrast, when a structure is described as being "directly connected" or "directly coupled" to another structure, intervening structures are present. When a structure is described as being "indirectly connected" or "indirectly coupled" to another structure, at least one intervening structure is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a back-end-of-line wiring structure, the method comprising:
   forming a trench intersecting a top surface of a dielectric layer and extending into the dielectric layer;
   forming a layer having a first vertical segment on a first sidewall of the trench, a second vertical segment on a second sidewall of the trench, and a horizontal segment connecting the first and second vertical segments;
   removing the horizontal segment of the layer; and
   depositing at least one electrical insulator on the top surface of the dielectric layer, the at least one electrical insulator including a portion that completely fills a space between the first vertical segment of the layer on the first sidewall of the trench and the second vertical segment of the layer on the second sidewall of the trench,
   wherein the layer is comprised of a conductor, and the layer has a thickness selected to provide a low resistance path for conducting a high frequency signal.

2. The method of claim 1 wherein the thickness of the layer is greater than or equal to a skin depth determined at an operating frequency for the high frequency signal.

3. A method of fabricating a back-end-of-line wiring structure, the method comprising:
   forming a trench intersecting a top surface of a dielectric layer and extending into the dielectric layer;
   forming a first layer having a first vertical segment on a first sidewall of the trench and a second vertical segment on a second sidewall of the trench;
   depositing at least one electrical insulator on the top surface of the dielectric layer, the at least one electrical insulator including a portion that completely fills a space between the first vertical segment of the layer on the first sidewall of the trench and the second vertical segment of the layer on the second sidewall of the trench; and
   forming a second layer on the portion of the at least one electrical insulator in the trench and connecting the first vertical segment of the first layer with the second vertical segment of the first layer,
   wherein the first layer comprised of a first conductor, the second layer is comprised of a second conductor, and the first and second layers each have a thickness selected to provide a low resistance path for conducting a high frequency signal.

4. A wiring structure comprising:
   a first dielectric layer having a top surface;
   a trench having a first sidewall and a second sidewall intersecting the top surface of the first dielectric layer;
   a first layer having a first vertical segment on the first sidewall of the trench and a second vertical segment on a second sidewall of the trench;
   at least one electrical insulator on the top surface of the first dielectric layer, the at least one electrical insulator including a portion that completely fills a space between the first vertical segment of the layer on the first sidewall of the trench and the second vertical segment of the layer on the second sidewall of the trench; and
   a second layer on the portion of the electrical insulator in the trench and connecting the first vertical segment of the first layer with the second vertical segment of the first layer,
   wherein the first layer is comprised of a first conductor, the second layer is comprised of a second conductor, and the first and second layers each have a thickness selected to provide a low resistance path for conducting a high frequency signal.

5. The wiring structure of claim 4 wherein the the thickness of the first and second layers is greater than or equal to a skin depth at an operating frequency of the high frequency signal.

6. The wiring structure of claim 4 wherein the first vertical segment and the second vertical segment of the first layer have a height of at least 10 μm, and the first surface layer has an aspect ratio greater than or equal to 10.

7. The wiring structure of claim 4 further comprising:
   a second dielectric layer; and
   a wire in the second dielectric layer, the wire aligned with the first sidewall and the second sidewall so that a bottom of the trench lands on the wire.

8. The wiring structure of claim 4 wherein the first conductor of the first layer is comprised of gold, copper, or silver.

9. The method of claim 1 wherein the thickness is greater than or equal to a skin depth determined at an operating frequency for the high frequency signal.

10. The wiring structure of claim 4 wherein the surface layer is a wire comprising a winding of an inductor.

11. The wiring structure of claim 4 wherein the first conductor and the second conductor are each comprised of gold, copper, or silver.

12. The method of claim 1 wherein the first vertical segment and the second vertical segment of the first layer have a height of at least 10 μm, and the first surface layer has an aspect ratio greater than or equal to 10.

* * * * *